(12) United States Patent
Andre

(10) Patent No.: US 9,030,213 B2
(45) Date of Patent: May 12, 2015

(54) METHOD AND SYSTEM FOR MEASURING A TIME CONSTANT OF AN INTEGRATED CIRCUIT, AND INTEGRATED CIRCUIT PROVIDED WITH SUCH A SYSTEM

(75) Inventor: Eric Andre, Hurtieres (FR)

(73) Assignee: ST-Ericsson SA, Plan-les-Ouates (CH)

( * ) Notice: Subject to any disclaimer, the term of this patent is extended or adjusted under 35 U.S.C. 154(b) by 746 days.

(21) Appl. No.: 13/148,274

(22) PCT Filed: Jan. 28, 2010

(86) PCT No.: PCT/EP2010/050966
§ 371 (c)(1),
(2), (4) Date: Oct. 17, 2011

(87) PCT Pub. No.: WO2010/086348
PCT Pub. Date: Aug. 5, 2010

(65) Prior Publication Data
US 2012/0025847 A1    Feb. 2, 2012

(30) Foreign Application Priority Data

Jan. 28, 2009  (FR) ..................................... 09 50524

(51) Int. Cl.
*G01R 27/28*    (2006.01)
*H03H 11/12*    (2006.01)

(52) U.S. Cl.
CPC ..................... *H03H 11/12* (2013.01)

(58) Field of Classification Search
CPC   H03H 11/12; H03H 2210/043; H03H 19/004
USPC ........................................................ 324/612
See application file for complete search history.

(56) References Cited

U.S. PATENT DOCUMENTS 5,150,324 A  *  9/1992  Takasuka et al. ............. 708/801
5,220,327 A  *  6/1993  Abbiate et al. ................ 341/143
(Continued)

FOREIGN PATENT DOCUMENTS

GB          2430565  A       3/2007

OTHER PUBLICATIONS

Rapport De Recherche Preliminaire; Institut National de la Propriete Industrielle (French Search Report); Sep. 17, 2009; Joseph Kreutz; 2 pages.

(Continued)

*Primary Examiner* — Patrick Assouad
*Assistant Examiner* — Demetrius Pretlow
(74) *Attorney, Agent, or Firm* — Howison & Arnott, LLP

(57) ABSTRACT

A method and system for measuring a time constant RC of an integrated electronic circuit is provided. This integrated circuit may be made up of a first hardware component and of a second hardware component wherein one of the hardware components is a resistive element and the other is a capacitive element. The first and the second hardware components are connected to an inverting input of an operational amplifier of an integrator of a delta-sigma modulator. A DC voltage is applied to the modulator input. The output signal $Q_s$ of the modulator is measured with the aid of an analog/digital converter, and the value of the time constant RC is determined on the basis of at least one measurement of the level of the DC component of the output signal $Q_s$ of the modulator carried out with the air of a measurement counter circuit.

11 Claims, 4 Drawing Sheets

(56) References Cited

U.S. PATENT DOCUMENTS

| | | |
|---|---|---|
| 5,245,646 A | 9/1993 | Jackson et al. |
| 5,621,329 A | 4/1997 | Tsao et al. |
| 5,914,633 A | 6/1999 | Comino et al. |
| 6,147,633 A * | 11/2000 | Ukawa et al. ............ 341/143 |
| 6,169,446 B1 | 1/2001 | Ramet et al. |
| 6,262,603 B1 | 7/2001 | Mohan et al. |
| 6,433,713 B1 | 8/2002 | Fuhrman |
| 6,803,813 B1 | 10/2004 | Pham |
| 7,078,961 B2 | 7/2006 | Punzenberger et al. |
| 7,230,555 B2 * | 6/2007 | Dolazza et al. ............ 341/143 |
| 7,265,611 B2 * | 9/2007 | Wang ............................ 330/9 |
| 7,692,568 B2 * | 4/2010 | Farooqi et al. ............ 341/143 |
| 7,982,526 B2 * | 7/2011 | Lee ............................ 327/337 |
| 2001/0038350 A1 * | 11/2001 | Andre et al. ............... 341/118 |
| 2004/0260500 A1 | 12/2004 | Punzenberger et al. |
| 2009/0039902 A1 * | 2/2009 | Hargreaves et al. ........ 324/686 |
| 2009/0153382 A1 * | 6/2009 | Philips ........................ 341/143 |
| 2010/0164773 A1 * | 7/2010 | Clement et al. ............ 341/143 |

OTHER PUBLICATIONS

Patent Cooperation Treaty International Search Report and Written Opinion for PCT/EP2010/050966; Oct. 20, 2010; 8 pages.

* cited by examiner ured Jan. 28, 2010, and entitled METHOD AND SYSTEM FOR MEASURING A TIME CONSTANT OF AN INTEGRATED CIRCUIT, AND INTEGRATED CIRCUIT PROVIDED WITH SUCH A SYSTEM

METHOD AND SYSTEM FOR MEASURING A TIME CONSTANT OF AN INTEGRATED CIRCUIT, AND INTEGRATED CIRCUIT PROVIDED WITH SUCH A SYSTEM

CROSS-REFERENCE TO RELATED APPLICATIONS

This application is a U.S. National Phase application submitted under 35 U.S.C. §371 of Patent Cooperation Treaty application serial no. PCT/EP2010/050966, filed Jan. 28, 2010, and entitled METHOD AND SYSTEM FOR MEASURING A TIME CONSTANT OF AN INTEGRATED CIRCUIT, AND INTEGRATED CIRCUIT PROVIDED WITH SUCH A SYSTEM, which application claims priority to French patent application serial no. 0950524, filed Jan. 28, 2009, and entitled METHOD AND SYSTEM FOR MEASURING A TIME CONSTANT OF AN INTEGRATED CIRCUIT, AND INTEGRATED CIRCUIT PROVIDED WITH SUCH A SYSTEM.

Patent Cooperation Treaty application serial no. PCT/EP2010/050966, published as WO 2010/086348, and French patent application serial no. 0950524, are incorporated herein by reference.

TECHNICAL FIELD

The invention relates to microelectronics, and more particularly to the measurement of a time constant RC with a view to its calibration.

BACKGROUND

It also pertains to an integrated circuit, in particular an analog/digital converter, provided with such a system.

Certain signal processing functions used in analog integrated circuits are based on the value of a time constant RC. Typically, the coefficients of an analog filter or else of an analog digital converter, such as a continuous-time delta-sigma analog digital converter, are achieved by means of resistance R and capacitances C.

The product RC of an analog filter corresponds to its cutoff frequency. For a continuous-time delta-sigma analog digital converter (ADC), this time constant RC is related to its sampling frequency. In both these cases, the precision of the time constant RC is important. For the cutoff frequency, if RC is estimated with too high a value, the filter cuts off a part of the signal, and if RC is too small, then the filter does not attenuate the signal sufficiently. In the case of the delta-sigma modulator, it is the performance and the stability of the modulator that depend directly on the precision of the value of RC. The RC coefficients achieve the transfer function of the continuous-time delta-sigma ADC.

Depending on the application, the precision with which the product RC must be known may be high or low. A precision of the value of the time constant RC of +/−5% is generally sufficient.

However, an integrated resistance is accuracy of +/−15% while the value of an integrated capacitance varies at least by +/−20% depending on the technology. In conclusion, the time constant RC that has a precision of +/−35%, is not sufficient for a great majority of applications.

Various schemes for calibrating a time constant are already known in the prior art. Reference may be made in this regard to the documents U.S. Pat. Nos. 6,169,446, 6,262,603, 6,803,813 and 7,078,961.

The calibration described in these documents is based on a comparison of the value of the time constant defined by the product RC with a known and accurate time base formulated, for example, by a quartz-driven clock, or on a comparison of the voltage across the terminals of the resistance R with that present across the terminals of the capacitance C when they are traversed by the same current.

These schemes for calibrating the time constant RC merely deliver a digital word, which directly controls a resistance or a variable capacitance.

Moreover, they are all sensitive to the analog imperfections intrinsic to the hardware components used to make the converter, such as the offset voltage of an operational amplifier or of the comparators used.

SUMMARY

In view of the foregoing, it is proposed to circumvent most of these limitations related to the calibration of a time constant by carrying out a measurement of a time constant within an integrated circuit having increased precision.

In one aspect, there is proposed, according to one mode of implementation, a method for measuring a time constant of an integrated electronic circuit made up of a first hardware component and of a second hardware component.

In this method, a first terminal of the first and of the second hardware components is coupled to an inverting input of an operational amplifier of an integrated electronic circuit, a continuous analog input signal is applied to a second terminal of the first hardware component, the output signal of the circuit is measured, and the value of the time constant is determined on the basis of at least one measurement of the level of the DC component of the output signal of the circuit.

The first hardware component is preferably a resistive element and the second element is a capacitive element.

It is also possible for the first hardware component to be a capacitive element and the second element a resistive element.

A switched capacitive device is advantageously formed with the capacitive element, each of the terminals of which are coupled to a make/break switch coupled to earth, the switching of the switched capacitive device being operated at the sampling frequency of the analog/digital converter of the circuit.

Preferably, a DC voltage equal in absolute value to the reference voltage of the digital/analog converter is delivered as continuous analog input signal of the integrated electronic circuit.

The measurement of the time constant can advantageously comprise a first measurement of the output signal of the circuit, for which the continuous analog input signal is a DC voltage equal to the reference voltage of the digital/analog converter, a second measurement of the output signal of the circuit, for which the continuous analog input signal is a DC voltage equal to the opposite of the reference voltage of the digital/analog converter, and a subtraction between the first measurement and the second measurement.

The measurement of the time constant RC can also comprise a no-load measurement of the output signal of the circuit, for which the continuous analog input signal is a zero DC voltage, an initial measurement of the output signal of the circuit, for which the continuous analog input signal is a DC voltage equal to the reference voltage of the digital/analog converter, and a subtraction between the no-load measurement and the initial measurement.

The integrated circuit can advantageously be a modulator of delta-sigma type.

There is also proposed a method of autocalibration of a time constant of an integrated electronic circuit made up of a first hardware component and of a second hardware component.

The method for measuring a time constant of an integrated electronic circuit made up of a first hardware component and of a second hardware component is advantageously used to calibrate the time constant of the said electronic circuit without an additional calibration circuit.

It is thus possible to achieve savings of surface area and therefore of cost related to the fact that there is no additional calibration circuit, while having increased precision given that what is implemented is measured without using pairing as a basis, this being a source of additional errors.

This autocalibration method is advantageously usable for continuous-time delta-sigma modulators using an active integrator with a switched-capacitance feedback digital/analog converter, or with a switched-resistance feedback digital/analog converter, or with a switched-current feedback digital/analog converter.

In another aspect, there is proposed, according to one embodiment, a system for measuring a time constant of an integrated electronic circuit made up of a first hardware component and of a second hardware component.

It comprises an operational amplifier having an inverting terminal coupled to a first terminal of the first hardware component and to a first terminal of the second hardware component, a second terminal of the first hardware component receiving a continuous analog input signal, means for measuring the output signal of the circuit receiving as input the said input continuous analog input signal, and means able to determine the value of the time constant on the basis of at least one measurement of the DC component of the output signal of the circuit.

The first hardware component preferably comprises a resistive element and the second hardware component comprises a capacitive element.

It is also possible for the first hardware component to comprise a capacitive element and the second hardware component to comprise a resistive element.

The system advantageously comprises a switched capacitive device comprising the capacitive element each of the terminals of which is coupled to a make/break switch coupled to earth, the switching of the switched capacitive device being operated at the sampling frequency of an analog/digital converter of the circuit.

Preferably, the continuous analog input signal delivered to the circuit is a voltage equal in absolute value to the reference voltage of the digital/analog converter of the circuit.

Advantageously, the means able to determine the value of the time constant comprise a decimation digital filter coupled at the output of the circuit.

The means able to determine the value of the time constant preferably comprise a first counter able to count a number of bits of a first value, and a second counter able to count the total number of bits output by the modulator.

The integrated electronic circuit can advantageously comprise a modulator of delta-sigma type.

BRIEF DESCRIPTION OF THE DRAWINGS

Other advantages and characteristics of a method and system for calibration of increased precision will be apparent on examining the detailed description of wholly non-limiting embodiments, and the appended drawings, in which.

DETAILED DESCRIPTION

Modes of implementation of a method and of a system for measuring a time constant of an integrated circuit will be described with reference to FIGS. 1 to 5.

In the modes described, the time constant is formed by a capacitor and a resistor. Furthermore, according to the aspects described, the integrated circuit consists of a modulator of delta-sigma type.

Figure 1:
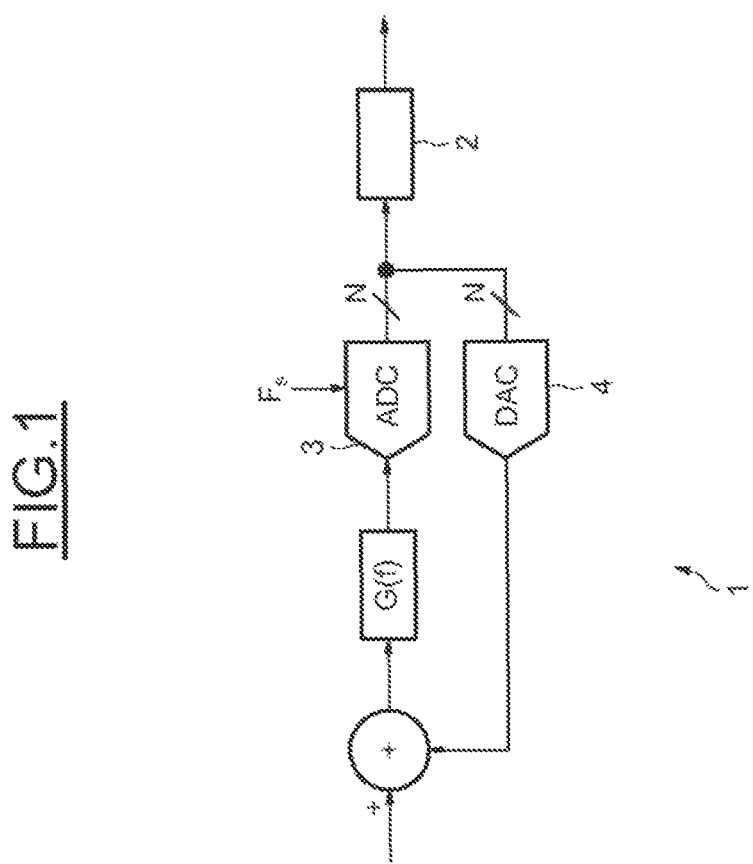
FIG. 1 represents a basic diagram of an analog/digital converter of delta-sigma type.

A basic diagram of a current-feedback continuous-time delta-sigma analog/digital converter, of order one, has been represented in FIG. 1. It comprises a modulator 1 of delta-sigma type followed by a decimation digital filter 2.

The modulator 1 is here an analog/digital converter with over-sampling and shaping of the quantization noise. It comprises an analog/digital converter 3 (ADC) of low resolution, typically 1 bit, placed in a negative feedback loop, which comprises a digital/analog converter 4 (DAC), and whose quantization noise is rejected towards the high frequencies by virtue of a function G(f) placed in the loop. The decimation digital filter 2 makes it possible to suppress the off-band quantization noise, and to reduce the throughput of the digitized signal to the Nyquist frequency after sub-sampling.

The performance of such a delta-sigma modulator depends on the over-sampling ratio, the number of bits N of the ADC/DAC pair and the order of the loop filter G(f).

Figure 2:
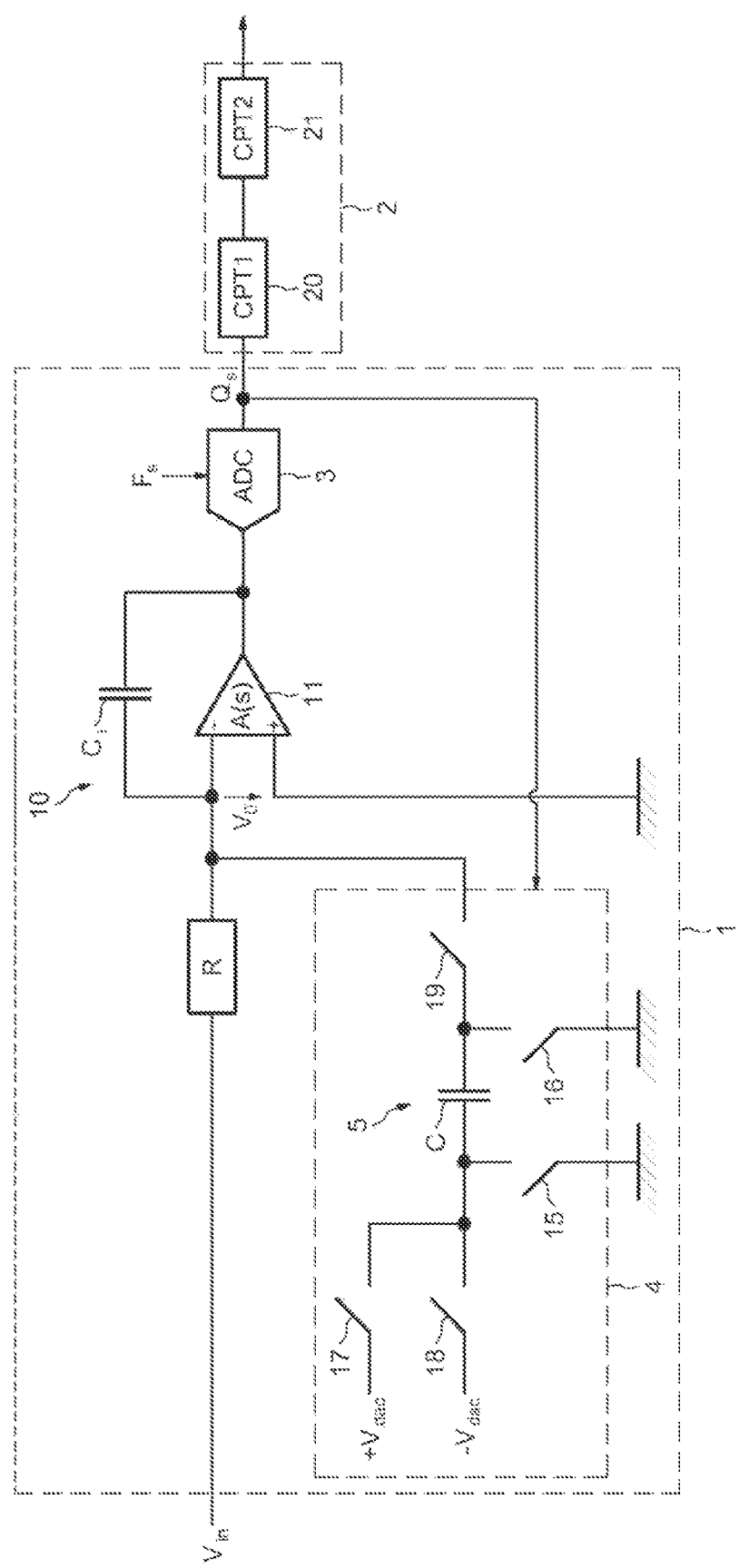
FIG. 2 presents an electronic diagram of a continuous-time delta-sigma analog/digital converter of order one with a switched-capacitance feedback digital/analog converter, according to one embodiment.

Based on the principle described in FIG. 1, an embodiment of a continuous-time delta-sigma analog/digital converter of order one and switched-capacitance feedback digital/analog converter, with a one-bit ADC/DAC pair making it possible to carry out a measurement of a time constant RC, has been detailed in FIG. 2. Here this converter is an analog/digital converter.

It comprises, as in the example of FIG. 1, a modulator 1 of delta-sigma type comprising an analog/digital converter 3 (ADC) and a digital/analog converter 4 (DAC), and a decimation filter 2. The principle of implementation of the continuous-time delta-sigma analog/digital converter and switched-capacitance feedback converter DAC is nevertheless independent of the order L and of the number of bits N of the modulator.

The modulator 1 essentially comprises an integrator 10 carrying out the function G(f) of the negative feedback loop of FIG. 1. This integrator 10 comprises an operational amplifier 11 and an integration capacitor Ci connected between the inverting terminal and the output terminal of the amplifier 11. This inverting terminal is coupled to a resistor R which receives the analog input signal Vin of the modulator 1. The non-inverting terminal of the amplifier 11 is connected to earth.

The integrator 10 possesses, moreover, an offset voltage V0 across the terminals of the operational amplifier 11.

The output of the operational amplifier 11 of the integrator 10 is coupled to the converter ADC 3, which samples the output of the integrator 10 at a sampling frequency Fs. The converter ADC 3 is coupled at output to a converter DAC 4, which is also coupled to the inverting terminal of the operational amplifier 11.

The converter DAC 4 comprises, in this embodiment, a switched capacitive device 5, consisting of a capacitor C of which a first terminal is coupled to a discharge make/break switch 15 and a second terminal is coupled to a charge make/break switch 16, the discharge make/break switch 15 and the charge make/break switch 16 both being coupled to earth. The switched capacitive device 5 consists also of a positive power supply make/break switch 17 making it possible to deliver a positive reference voltage of the converter DAC 4 to the capacitor C, of a negative power supply make/break switch 18 making it possible to deliver the opposite of the reference voltage of the converter DAC 4 to the capacitor C, and of a connection make/break switch 19.

Thus, the capacitor C charges when the charge make/break switch 16 and the positive power supply make/break switch 17 or the negative power supply make/break switch 18 are closed, whilst the other make/break switches 15 and 19 are open. The capacitor C discharges thereafter when the discharge make/break switch 15, and the connection make/break switch 19 are closed whilst the other make/break switches 16, 17 and 18 are open.

The converter ADC 3 controls the converter DAC 4 on the basis of the measurement of the output signal of the integrator 10, and more particularly the power supply of the capacitor C by controlling the positive power supply make/break switch 17, and the negative power supply make/break switch 18.

The decimation filter 2 of the current-feedback continuous-time delta-sigma analog/digital converter comprises a first counter 20 (CPT1) able to count a number of bits of a first value, and a second counter 21 (CPT2) able to count the total number of bits output by the modulator 1.

Figure 3:
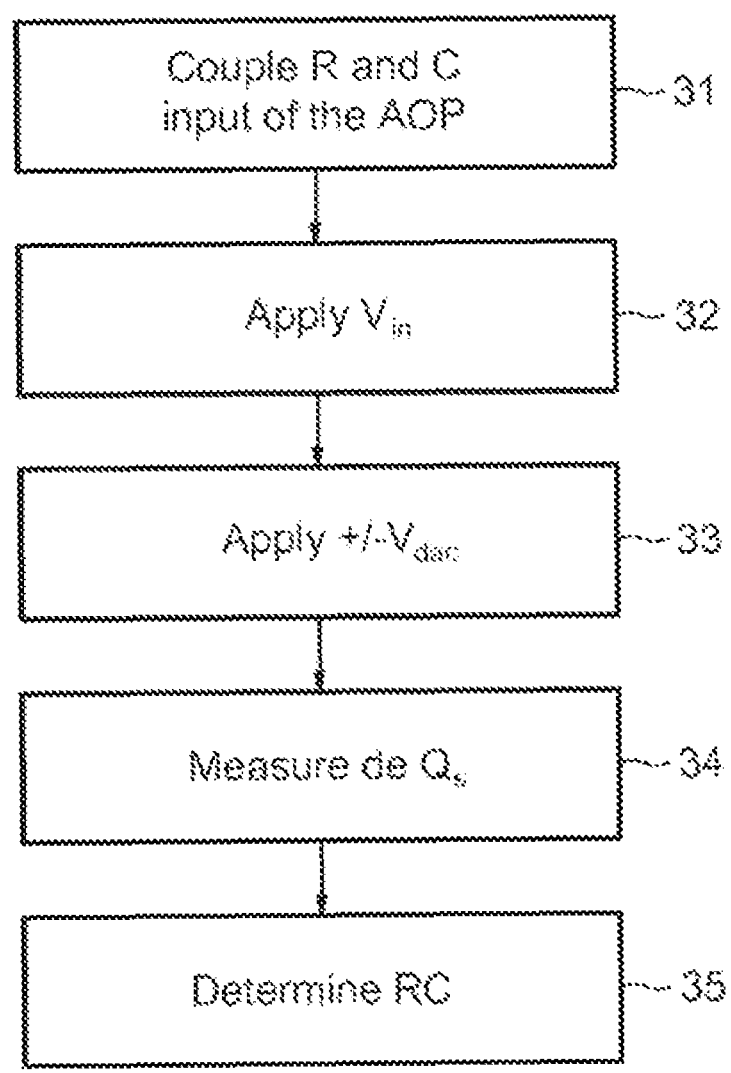
FIG. 3 illustrates a method for measuring the time constant according to one mode of implementation.

FIG. 3 illustrates a method for measuring the time constant RC of an integrated electronic circuit made up of a resistive element R and of a capacitive element C.

In a first step 31, a coupling is effected between the resistor R and the switched capacitive device 5, constructed on the basis of the capacitor C, at the input of the operational amplifier 11 of the integrator 10 of the modulator 1. In a following step 32, a known analog input signal Vin whose voltage is constant is applied at the input of the modulator 1. In a step 33, a reference voltage +Vdac or −Vdac of the converter DAC 4 is applied across the terminals of the switched capacitive device 5, which is switched at the sampling frequency of the converter ADC 3. In a following step 34, the voltage of the output signal Qs of the modulator 1 is measured with the aid of two counters 20 and 21 of the measurement means 2. In a final step 35, the value of the time constant RC is determined on the basis of at least one measurement of the level of the DC component of the signal of Qs of the modulator 1.

As indicated previously, an offset voltage V0 exists across the terminals of the operational amplifier 11 of the integrator 10. This shift voltage modifies the value of the analog input voltage Vin and engenders an error in the measured value of the voltage Qs.

Figure 4:
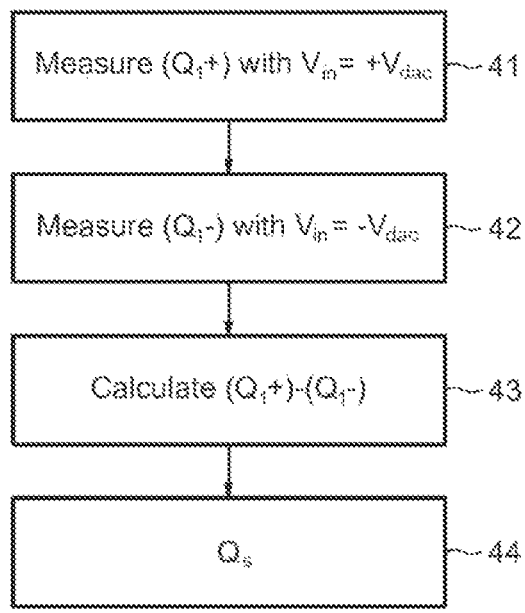
FIG. 4 presents a first mode of implementation of a method for measuring the output signal Qs circumventing the offset voltage.

A first mode of implementation of a method for measuring the output signal Qs making it possible to circumvent the offset voltage V0 of the operational amplifier 11 is presented in FIG. 4.

In a first step 41, a first measurement Q1+ of the output voltage Qs is performed for a continuous analog input voltage equal to the reference voltage of the converter DAC 4, i.e. Vin=+Vdac, corresponding to a closed position of the make/break switch 17. In a second step 42, a second measurement Q1− of the output voltage Qs is carried out for a continuous analog input voltage equal to the opposite of the reference voltage of the converter DAC 4, i.e. Vin=−Vdac, corresponding to a closed position of the make/break switch 18. In a step 43, the value of the second measurement Q1− is then subtracted from the value of the first measurement Q1+, and in a step 44, an output voltage value and thus a ratio of the input and reference voltages of the converter DAC 4, Vin/Vdac, is determined independently of the value of the offset voltage V0.

Figure 5:
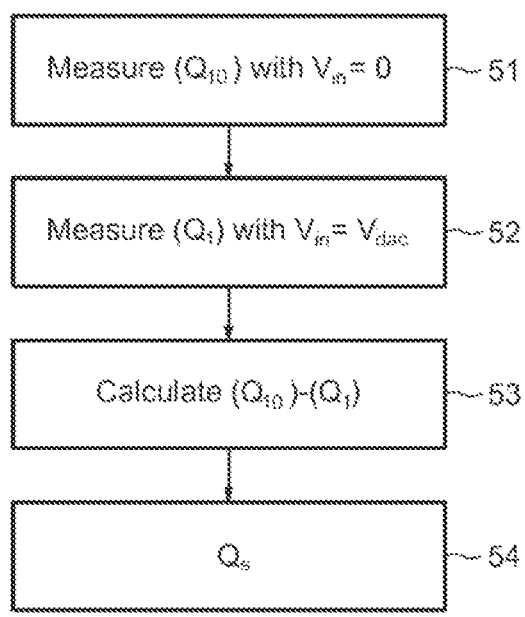
FIG. 5 presents a second mode of implementation of a method for measuring the output signal Qs circumventing the offset voltage.

A second mode of implementation of a method making it possible to circumvent the offset voltage V0 of the operational amplifier 11 is presented in FIG. 5. In a first step 51, a first measurement Q10 of the output voltage Qs is performed for a zero continuous analog input voltage, i.e. Vin=0, it then being possible for the output voltage Qs to be due only to the offset voltage V0 across the terminals of the operational amplifier 11. This measurement makes it possible to determine the error due to the offset. In a step 52, a second measurement Q1 of the output voltage Qs is carried out for a continuous analog input voltage equal to the reference voltage of the converter DAC 4, i.e. Vin=Vdac, corresponding to a closed position of the make/break switch 17. In a step 53, the measured error Q10 due to the offset voltage V0 is then subtracted from the voltage at the value of the second measurement Q1 performed. In a step 54, an output voltage value Qs is then determined independently of the value of the offset voltage V0.

In these two modes of implementation of a method for measuring the output signal Qs, the voltage of the input signal Vin being equal in absolute value to the voltage of the reference signal Vdac of the digital analog converter 4, and the output voltage Q(s) being equal to the ratio of the impedances of the two hardware components, multiplied by the ratio of the input and reference voltages Vin/Vdac, the output voltage is directly equal to the ratio of the impedances of the first and of the second hardware components.

The measured level of the output signal Qs component is thus equal to the time constant RC or else to the inverse of the time constant 1/RC depending on whether the first hardware component is the resistive element or the capacitive element.

There is therefore proposed, according to the present description, that the use of an integrated electronic circuit, in particular a continuous-time delta-sigma converter and switched-capacitance converter DAC, make it possible to provide a measurement of the time constant RC on the basis of a measurement of a DC input voltage of the circuit, and in particular of the modulator. By choosing an analog input voltage equal to the reference voltage of the digital/analog converter DAC, the precision of the measurement is improved. Moreover, the measurement can circumvent the defects introduced by the shift voltage of the operational amplifier used to achieve the integrator of the converter.

The result of the measurement of the time constant RC can be used subsequently to calibrate a filter or any other element using the value of such a time constant RC.

The invention claimed is:

1. A method for measuring a time constant (RC) of an integrated electronic circuit made up of a first hardware component and of a second hardware component, wherein a first terminal of the first and of the second hardware components is coupled to an inverting input of an operational amplifier of a circuit within the integrated electronic circuit, the method comprising:

applying a continuous analog input signal to a second terminal of the first hardware component;

measuring a DC level measurement of an output signal (Qs) of the circuit by an analog/digital converter at a sampling frequency (Fs);

determining the value of a time constant (RC) based on at least one DC level measurement of the output signal (Qs), wherein the first hardware component comprises a resistive element and the second hardware component comprises a capacitive element, and wherein the capacitive element comprises a switched capacitive device, the switched capacitive device comprises a plurality of terminals such that each one of the terminals is coupled to a different one of a plurality of make/break switches, and wherein each one of the make/break switches are coupled to ground; and switching the switched capacitive device at the sampling frequency (Fs) of the analog/digital converter.

2. The method according to claim 1, wherein the continuous analog input is a DC voltage equal, in absolute value, to a reference voltage of a digital/analog converter.

3. The method according to claim 1, wherein determining the value of the time constant (RC) further comprises:

measuring a first value (Q1+) of the output signal (Qs) when the continuous analog input signal (Vin) is a DC voltage equal to a reference voltage (+Vdac) of the digital/analogue converter;

measuring a second value (Q1−) of the output signal (Qs) when the continuous analog input signal (Vin) is a DC voltage equal to the opposite of the reference voltage (−Vdac); and performing a subtraction between the first value (Q1+) and the second value (Q1−).

4. The method according claim 1, wherein determining the value of the time constant (RC) comprises:

measuring a no-load measurement (Q10) of the output signal (Qs) when the continuous analog input signal (Vin) is a zero DC voltage;

measuring an initial value (Q1) of the output signal (Qs) when the continuous analogue input signal (Vin) is a DC voltage equal to a reference voltage (+Vdac); and performing a subtraction between the no-load measurement (Q10) and the initial value (Q1).

5. The method according to claim 1, wherein the circuit is a modulator of delta-sigma type within the integrated circuit.

6. The method according to claim 1, further comprising using the determined value of a time constant (RC) to auto-calibrate the time constant (RC) of the circuit without an additional calibration circuit.

7. A system for measuring a time constant (RC) of an integrated electronic circuit comprising a first hardware component and of a second hardware component, the system comprising:

an operational amplifier having an inverting terminal coupled to a first terminal of the first hardware component and to a first terminal of the second hardware component, the second terminal of the first hardware component being configured to receive a continuous analog input signal;

an analog/digital converter (ADC) connected to receive an output of the operational amplifier and, at a sampling frequency (Fs), and convert the operational amplifier output to a measured output signal (Qs) of the integrated electronic circuit;

a decimation digital filter configured to determine a value of the time constant (RC) based on at least one measurement of a DC component of the measured output signal (Qs);

wherein the second hardware component comprises a switched capacitive device comprising a capacitive element having two terminals, wherein each of the two terminals is coupled to a different make/break switch, each make/break switch being coupled to earth, the switched capacitive device configured to switch at the sampling frequency (Fs) of the analog/digital converter.

8. The system of claim 7, wherein the continuous analog input signal is a voltage equal to an absolute value of a reference voltage (+Vdac) of a digital/analog converter.

9. The system of claims 7, wherein the decimation digital filter comprises a first counter configured to count a number of bits of a first value, and a second counter configured to count a total number of bits in the measured output signal.

10. System of claim 7, wherein the integrated circuit comprises a delta-sigma type modulator.

11. A method for measuring a time constant (RC) of an integrated electronic circuit made up of a first hardware component and of a second hardware component, wherein a first terminal of the first and of the second hardware components is coupled to an inverting input of an operational amplifier of a circuit within the integrated electronic circuit, the method comprising:

applying a continuous analog input signal (Vin) to a second terminal of the first hardware component;

measuring a DC level measurement of an output signal (Qs) of the circuit;

determining the value of a time constant (RC) based on at least one DC level measurement of the output signal (Qs) wherein the first hardware component comprises a resistive element and the second hardware component comprise a capacitive element, and wherein the capacitive element comprises a switched capacitive device, the switched capacitive device comprises a plurality of terminals such that each of the terminals is coupled with one of a plurality of make/break switches, and wherein each of the make/break switches is coupled to ground, and wherein determining the value of the time constant further comprises;

measuring a first value (Q1+) of the output signal (Qs) when the continuous analog input signal is a DC voltage equal to a reference voltage (+Vdac) of a digital/analog converter;

measuring a second value (Q1−) of the output signal (Qs) when the continuous analog input signal (Vin) is a DC voltage equal to the opposite of the reference voltage (−Vdac);

performing a subtraction between the first value (Q1+) and the second value (Q1−); and switching the switched capacitive device at the sampling frequency (Fs) of the analog/digital converter.

* * * * *